(12) United States Patent
Lehr et al.

(10) Patent No.: US 8,561,446 B2
(45) Date of Patent: Oct. 22, 2013

(54) METHOD AND DEVICE FOR FABRICATING BONDING WIRES ON THE BASIS OF MICROELECTRONIC MANUFACTURING TECHNIQUES

(75) Inventors: Matthias Lehr, Dresden (DE); Frank Kuechenmeister, Dresden (DE); Frank Seliger, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 909 days.

(21) Appl. No.: 12/562,556

(22) Filed: Sep. 18, 2009

(65) Prior Publication Data

US 2010/0107717 A1 May 6, 2010

(30) Foreign Application Priority Data

Oct. 31, 2008 (DE) .................. 10 2008 054 077

(51) Int. Cl.
 *B21C 3/02* (2006.01)
 *B21C 1/00* (2006.01)
(52) U.S. Cl.
 USPC ............. 72/274; 72/253.1; 72/261; 72/282; 72/467
(58) Field of Classification Search
 USPC ............ 72/274, 253.1, 261, 467, 282
 See application file for complete search history.

(56) References Cited

U.S. PATENT DOCUMENTS

| | | | | |
|---|---|---|---|---|
| 3,605,476 A * | 9/1971 | Hinshaw | | 72/274 |
| 4,080,706 A * | 3/1978 | Heilman et al. | | 29/592 |
| 4,397,080 A * | 8/1983 | Muusse | | 148/542 |
| 4,464,922 A * | 8/1984 | Pamplin et al. | | 72/286 |
| 4,468,947 A * | 9/1984 | Takeda et al. | | 72/467 |
| 4,938,244 A * | 7/1990 | Kumada et al. | | 136/212 |
| 5,636,545 A * | 6/1997 | Anthony et al. | | 72/467 |
| 6,815,736 B2 * | 11/2004 | Mascarenhas | | 257/201 |
| 7,131,308 B2 * | 11/2006 | McCullough et al. | | 72/258 |
| 7,172,789 B2 * | 2/2007 | Smith et al. | | 427/162 |
| 7,601,570 B2 * | 10/2009 | Damlencourt | | 438/149 |
| 8,149,564 B2 * | 4/2012 | Liu et al. | | 361/277 |
| 2004/0004058 A1 * | 1/2004 | Smith et al. | | 216/41 |
| 2004/0187539 A1 | 9/2004 | Ishizuka | | 72/282 |
| 2005/0173739 A1 * | 8/2005 | Kusumoto et al. | | 257/263 |
| 2005/0285149 A1 * | 12/2005 | Chang | | 257/210 |

(Continued)

FOREIGN PATENT DOCUMENTS

DE 1115937 10/1961
DE 31 39 796 A1 4/1983

OTHER PUBLICATIONS

Johnson, Colin. Nanowires Formed Using Extrusion Technique. EETimes. Nov. 3, 20003. retrieved from <http://www.eetimes.com/electronics-news/4046159/Nanowires-formed-using-extrusion-technique> on Jan. 2, 2013.*

(Continued)

*Primary Examiner* — Dana Ross
*Assistant Examiner* — Onekki Jolly
(74) *Attorney, Agent, or Firm* — Williams, Morgan & Amerson, P.C.

(57) ABSTRACT

Bonding wires for sophisticated bonding applications may be efficiently formed on the basis of a corresponding template device that may be formed on the basis of semiconductor material, such as silicon, in combination with associated fabrication techniques, such as lithography and etch techniques. Hence, any appropriate diameter and cross-sectional shape may be obtained with a high degree of accuracy and reliability.

24 Claims, 5 Drawing Sheets

(56) References Cited

U.S. PATENT DOCUMENTS

| | | | | |
|---|---|---|---|---|
| 2006/0281321 A1* | 12/2006 | Conley et al. | ............... | 438/703 |
| 2007/0090849 A1* | 4/2007 | Mayder | ............... | 324/763 |
| 2007/0187731 A1* | 8/2007 | Chang | ............... | 257/288 |
| 2007/0281156 A1* | 12/2007 | Lieber et al. | ............... | 428/373 |
| 2008/0008844 A1* | 1/2008 | Bettge et al. | ............... | 427/576 |
| 2008/0014689 A1* | 1/2008 | Cleavelin et al. | ............... | 438/197 |
| 2008/0041814 A1* | 2/2008 | Romano et al. | ............... | 216/13 |

OTHER PUBLICATIONS

Translation of Official Communication from German Patent Office for German Patent Application No. 10 2008 054 077.3-34 dated Nov. 29, 2010.

PCT Search Report and Written Opinion for PCT/US2009/005894 dated Feb. 24, 2010.

\* cited by examiner

METHOD AND DEVICE FOR FABRICATING BONDING WIRES ON THE BASIS OF MICROELECTRONIC MANUFACTURING TECHNIQUES

BACKGROUND OF THE INVENTION

1. Field of the Invention

The present disclosure generally relates to wire bonding, and, more particularly, to techniques and devices for fabricating bonding wires.

2. Description of the Related Art

The manufacturing of integrated circuits involves many complex process steps to form circuit elements, such as transistors, capacitors, resistors and the like, in and above an appropriate semiconductor material. In recent years, enormous advances have been made in increasing integration density and overall functionality of the integrated circuits. These advances have been achieved by scaling the individual circuit elements to dimensions in the deep sub-micrometer range, with currently used critical dimensions, such as the gate length of a field effect transistor, of 30 nm and less. Hence, millions of circuit elements may be provided in a die, so that a complex connection fabric may also have to be designed, in which, typically, each circuit element may be electrically connected to one or more other circuit elements. These interconnect structures are typically established in a metallization system comprising one or more wiring levels, in which appropriate metal features are formed according to the circuit configuration under consideration, in a similar manner as a multi-level printed circuit board, wherein, however, the dimensions of the metal features have to be adapted to the dimensions of the semiconductor circuit elements, such as the transistors and the like.

In an advanced stage of the manufacturing of integrated circuits, it is usually necessary to package a chip and provide leads and terminals for connecting the chip circuitry with the periphery. Well-established approaches for connecting chips with a package include wire bonding techniques, which have been successfully developed over the last decades on the basis of aluminum and are still well established and represent the dominant technology for connecting the vast majority of semiconductor chips to a carrier substrate, wherein, usually, aluminum-based bond pads are provided, which are contacted by an appropriate wire made of aluminum, copper, gold and the like. During the wire bonding process, the bond wire is brought into contact with the bond pad and, upon applying pressure, elevated temperature and ultrasonic energy, the wire is welded to the bond pad to form an intermetallic connection.

In this manner, a reliable electrical connection may be established between the metallization system of the integrated circuit and any peripheral components, such as a substrate package and the like. Due to the ongoing shrinkage of feature sizes of sophisticated semiconductor devices, the complexity of integrated circuits may be continuously increased, thereby also requiring increased I/O (input/output) capabilities, which in turn necessitates an increased number of bond pads to be provided at appropriate positions, such as the chip periphery. Consequently, the size and also the pitch of the bond pads may be reduced, thereby requiring sophisticated wire bond techniques for positioning and connecting the bonding wire to the corresponding bond pads. For this reason, the diameter of the bonding wires may also have to be reduced to comply with the requirement for reduced lateral dimensions of the bond pads and also with respect to not unduly wasting valuable raw materials, such as gold and the like. Typically, bonding wires are formed by pulling a pretreated wire through a corresponding diamond crystal having formed therein an appropriate opening, the width of which substantially determines the desired target diameter of the bonding wire.

FIG. 1 schematically illustrates a schematic view of an apparatus 150 for providing a bonding wire having a desired target diameter. As illustrated, a material source 151 is provided, which may supply a preform 152 of a bonding wire, such as a gold wire, a copper wire, an aluminum wire and the like, the diameter of which may, however, not correspond to a desired diameter 152D. Furthermore, the apparatus 150 comprises a device 100 that is configured to act as a template when the preform 152 is pulled through an opening 102 that is formed in a body 101 comprised of a diamond crystal. Due to the interaction of the opening 102, which may act as a template, the preform 152 may be reduced to the desired target diameter 152D, thereby obtaining a bonding wire 152A that may be used for connecting to a bond pad, as is described above. When reducing the target diameter 152D, corresponding diamond crystals having respective openings 102 also may have to be formed, which is typically accomplished by drilling a corresponding hole into the diamond crystal body, thereby requiring sophisticated mechanical tools and techniques. Consequently, a precise control of the target diameter of sophisticated bonding wires may depend on the precision with which the corresponding template holes 102 may be formed in the diamond body 101. Consequently, changing the diameter of a bonding wire may be associated with significant efforts with respect to providing an appropriate device 100 based on conventional techniques involving the mechanical drilling of corresponding openings into a crystalline diamond body.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques and devices which may be used for providing sophisticated bonding wires with a high degree of flexibility with respect to selecting a desired target diameter of bonding wires, while nevertheless providing an efficient manufacturing process for providing a respective template device. To this end, appropriate semiconductor materials may be used as a substrate for forming therein an appropriate template opening for defining a desired target diameter of a bonding wire. For example, a crystalline silicon material may be efficiently used as an appropriate base for forming therein an appropriate opening, which may be accomplished on the basis of well-established micromechanical or microelectronic manufacturing techniques, so that a high degree of flexibility may be provided with respect to selecting a desired target diameter, a corresponding cross-sectional shape of the bonding wire and an appropriate adaptation of the overall mechanical and geometric configuration of the base or body material having formed therein a corresponding template opening. In this respect, it should be appreciated that the term "diameter" as used herein is to be understood as a dimension of a cross-section of an opening or a bonding wire wherein the cross-sectional shape of the opening and the bonding wire may not necessarily be a circular shape but may be represented by any appropriate shape. In this case, the "diameter" may identify the greatest one of any possible cross-sectional dimensions. For example, for a square sectional shape of a corresponding opening, the "diameter" may be represented by the diagonal of the square.

Thus, by applying well-established micromechanical or microelectronic manufacturing techniques, corresponding template openings may be provided with a high degree of accuracy, for instance on the basis of lithography and related etch techniques and the like, while also a wide class of appropriate materials may be available, such as silicon, in combination with other rigid and highly stable materials, such as silicon nitride, silicon dioxide and the like. Hence, not only a cross-sectional shape and the diameter of a corresponding template opening may be provided with high precision and with a high degree of reproducibility, but also an appropriate length of a corresponding template opening may be adjusted, for instance, by selecting an appropriate thickness of a substrate material, such as a silicon substrate, which may be accomplished by adding further material by deposition, removing material by etching and/or polishing techniques, while, in other cases, additionally to or alternatively to the above techniques, appropriate substrate bonding processes may be used in order to combine various substrates, such as semiconductor wafers, which may be processed prior to or after the bonding in order to obtain the desired template openings.

One illustrative template device for preparing bonding wires disclosed herein comprises a body comprised of semiconductor material and a template opening extending through the body and having a diameter, at least at one section along a depth direction of the template material, that corresponds to a target diameter of the bonding wire.

One illustrative apparatus for forming a bonding wire comprises a material source for delivering a preform of a bonding wire. Moreover, the apparatus comprises a template device attached to the material source and comprising a body comprised of a semiconductor material that has formed therein a template opening extending through the body. The template opening has a diameter, at least at one section along a depth direction of the template opening, that corresponds to a target diameter of the bonding wire. Furthermore, the apparatus comprises a pull mechanism configured to pull the preform of the bonding wire supplied by the material source through the template opening.

One illustrative method disclosed herein comprises forming an opening through a substrate that comprises a semiconductor material, wherein the opening has a diameter, at least at one position along a depth direction, that corresponds to a target diameter of a bonding wire. Furthermore, the method comprises pulling a preform of the bonding wire through the opening to obtain the bonding wire having a diameter as defined by the opening.

BRIEF DESCRIPTION OF THE DRAWINGS

The disclosure may be understood by reference to the following description taken in conjunction with the accompanying drawings, in which like reference numerals identify like elements, and in which.

Figure 1A:
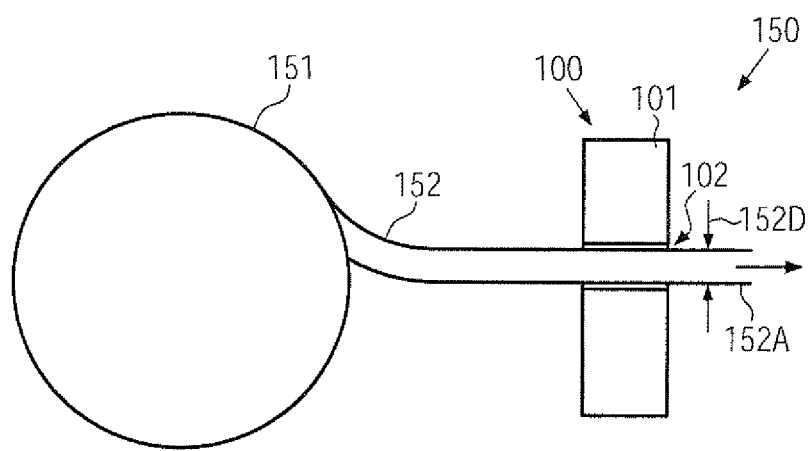
FIG. 1 schematically illustrates a conventional apparatus for supplying a bonding wire on the basis of a preform using a diamond crystal including a corresponding template opening for defining the final diameter of the bonding wire.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides techniques and devices in which the cross-sectional shape and the diameter of bonding wires may be efficiently determined on the basis of well-established process techniques as are typically used in the fabrication of microelectronic devices or micromechanical devices. That is, contrary to the conventionally used diamond crystals, other appropriate materials, such as silicon, silicon dioxide, silicon nitride and the like, may be used and may be processed to obtain corresponding template openings or through holes, wherein corresponding diameters may be precisely adjusted on the basis of well-established process techniques. Hence, a desired number of template devices may be produced in an efficient manner, for instance, on the basis of semiconductor wafers, which may be separated in order to provide a corresponding number of devices exhibiting a high degree of uniformity. In other cases, a variety of different template openings may be formed in a common manufacturing sequence, since the diameter of these openings may be efficiently defined on the basis of a lithography mask having respective mask features corresponding to the desired cross-sectional shapes and diameters. Moreover, manufacturing techniques may be available which may efficiently achieve an appropriate adaptation of the cross-sectional diameter along the entire length of a corresponding through hole, for instance, by appropriately adjusting etch parameters in order to provide different sidewall angles during the corresponding etch process. Additionally, the entire length of a corresponding through hole may be efficiently adjusted by well-established techniques, such as deposition of material layers, when a thickness of a basic substrate material may be considered as not sufficient. In other cases, a basic substrate material may be thinned, for instance by etching, polishing and the like, so as to obtain a desired length for the corresponding through holes. Moreover, wafer bond techniques may be used to combine two or more substrate materials according to well-established techniques, thereby providing a possibility of creating even very thick composite substrate materials, wherein a corresponding thickness may then be finely tuned on the basis of etch techniques, polishing techniques and the like. Consequently, by using appropriate semiconductor materials, such as silicon and the like, possibly in combination with related and well-established material compositions, for instance in the form of silicon dioxide, silicon nitride and silicon carbide and the like, superior mechanical characteristics may be accomplished while a high temperature stability is also typically achieved. Thus, these materials may be well-suited for forming therein corresponding template openings for adjusting the shape and diameter of bonding wires, while additionally a high degree of flexibility may be provided with respect to the cross-sectional shape and size of the template openings, while also a high degree of precision and reproducibility may be accomplished.

With reference to FIGS. 2a-2k, further illustrative embodiments will now be described, wherein reference may also be made to FIG. 1, if appropriate.

Figure 2A:
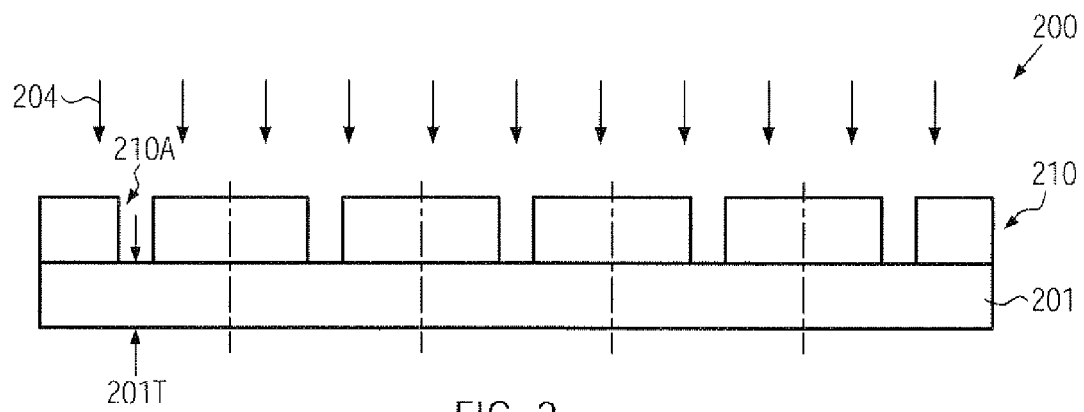
FIGS. 2a-2b schematically illustrate cross-sectional views of a semiconductor substrate during various manufacturing stages in forming through holes that may define a diameter of a bonding wire, wherein etch techniques may be used, in accordance with illustrative embodiments.

FIG. 2a schematically illustrates a device 200, which may also be referred to as a template device since it may be used as a "template" for forming bonding wires on the basis of a corresponding preform, such as a wire material having an increased diameter which may have to be reduced to a desired diameter, possibly in combination with adapting the cross-sectional shape of the bonding wire. The template device 200 may be comprised of a substrate 201 formed of a semiconductor material such as silicon, silicon carbide, silicon/germanium and the like which is typically provided in the form of a crystalline material. For instance, silicon wafers, silicon carbide wafers and the like may readily be available and may be processed on the basis of process tools and manufacturing techniques as are typically used in semiconductor production facilities and the like. Thus, the substrate 201 may have a well-defined thickness 201T and also a well-defined material composition. It should be appreciated that the thickness 201T may be adjusted by appropriately slicing corresponding semiconductor crystals, while, in other cases, corresponding available semiconductor substrates may be used, wherein a desired thickness 201T may be adjusted on the basis of manufacturing techniques, as will be described later on in more detail. Furthermore, the substrate 201 may have a well-defined diameter and shape, wherein, in some illustrative embodiments, wafers may be used, thereby providing the possibility of processing the device 200 on the basis of well-established and available semiconductor manufacturing tools. It should be appreciated, however, that the principles disclosed herein may also be applicable to any desired form of the substrate 201. For example, the diameter of the substrate 201 may range from 100-300 mm, which may represent well-established diameters as are also used in the semiconductor fabrication. Similarly, the thickness 201T may range from approximately 100 micrometers to several hundred micrometers for available semiconductor substrates, while also different values for the thickness 201T may be obtained on the basis of a further processing of the substrate 201. Furthermore, in the manufacturing stage shown, the device 200 may have formed thereabove an etch mask 210, such as a resist mask, possibly in combination with a hard mask material (not shown), which is to be understood as any appropriate material that may withstand higher temperatures and which may have a higher etch resistivity compared to a resist material. For example, the etch mask 210 may comprise any appropriate material, such as silicon dioxide, silicon nitride and the like, possibly in combination with a resist material, depending on the overall process strategy. The etch mask 210 may comprise a plurality of openings 210A, which may have the same cross-sectional shape and the same diameter, while, in other cases, at least some of the openings 210A may have a different diameter and/or a different cross-sectional shape. It should be appreciated that each of the openings 210A may represent a corresponding template opening to be formed in a specific portion of the substrate 201, which may be separated, if desired, in a later manufacturing stage in order to provide a corresponding body of an individual template device having a dedicated template opening formed on the basis of the etch mask 210. For example, the openings 210A may have a diameter of approximately 30-150 μm, depending on the desired target diameter of a corresponding bonding wire. It should be appreciated, however, that any other appropriate diameter may be selected.

The device 200 as illustrated in FIG. 2a may be formed on the basis of the following processes. After providing the substrate 201, for instance in the form of a silicon substrate and the like, a hard mask material may be formed, for instance by depositing any appropriate material, such as silicon dioxide, silicon nitride, silicon carbide and the like, followed by the deposition of a resist material, which may then be exposed on the basis of well-established lithography techniques. Thereafter, the resist material or the hard mask material may be patterned on the basis of the exposed and developed resist material in accordance with well-known techniques. Thereafter, the device 200 may be exposed to an etch ambient 204, which is established on the basis of an appropriate plasma ambient and an appropriate precursor material in order to obtain a corresponding reactive chemistry for etching material of the substrate 201 selectively with respect to the etch mask 210. For this purpose, a plurality of well-established process recipes are available, for instance on the basis of fluorine- or chlorine-containing etch chemistries, in order to etch silicon material selectively to resist material, silicon dioxide, silicon nitride and the like. It should be appreciated that respective etch processes for etching deep openings into a semiconductor material such as silicon and the like are well established, since similar techniques may also be used for trench etch processes for forming deep capacitors, while, in other cases, corresponding through holes may typically be provided in semiconductor substrates that are to be used in stacked chip configurations, wherein the corresponding through holes may be filled with a conductive material so as to provide electrical connections between different chips that are stacked on top of each other, thereby forming a three-dimensional chip configuration. Hence, corresponding etch recipes may be used for forming corresponding openings into the substrate material 201. Moreover, process parameters of these anisotropic etch techniques may be adjusted so as to obtain a desired etch behavior, that is, corresponding tapered openings may be formed by appropriately selected process parameters, such as a concentration of polymer species that may typically be added to the reactive etch ambient in order to control the lateral etch rate. Hence, a high degree of flexibility in adjusting the diameter along the depth or thickness of the substrate 201 is provided in order to appropriately adapt the diameter variation to the mechanical requirements for efficiently pulling a bonding wire through the corresponding opening.

Figure 2B:
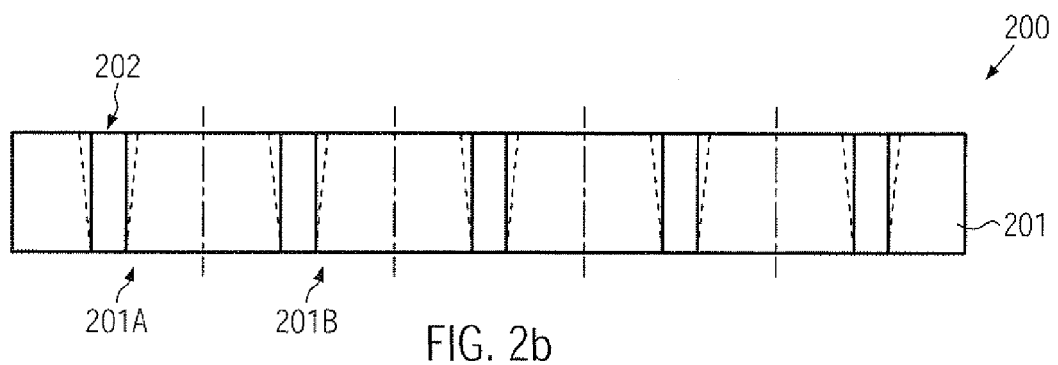

FIG. 2*b* schematically illustrates the device 200 in a further advanced manufacturing stage. As illustrated, corresponding openings 202 are formed through the substrate 201, wherein a corresponding degree of tapering, as indicated by the dashed lines, may be adjusted on the basis of process parameters of the etch ambient 204 as discussed above with reference to FIG. 2*a*. It should be appreciated that, if required, appropriate etch stop materials may be formed on the substrate 201 opposite to the etch mask 210 (FIG. 2*a*), if required. The corresponding etch stop materials may be efficiently removed on the basis of any appropriate selective etch recipe. Similarly, the etch mask 210 may be removed on the basis of well-established etch recipes. Thus, the substrate 201 may be separated into individual bodies 201A, 201B . . . , for instance, by well-established wafer dicing techniques and may subsequently be used as template devices in an apparatus for forming bonding wires of a desired target diameter and cross-sectional shape, as will be described later on.

Figure 2C:
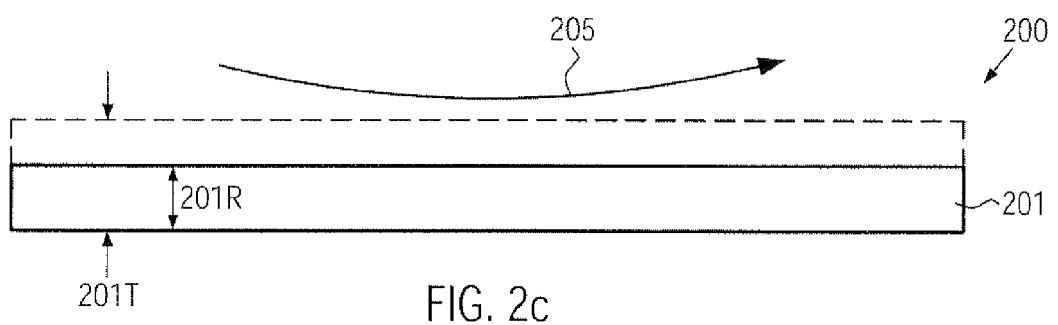
FIG. 2c schematically illustrates a cross-sectional view of a semiconductor substrate when adjusting a thickness thereof so as to obtain a desired length of corresponding through holes for forming bonding wires, according to illustrative embodiments.

FIG. 2*c* schematically illustrates the device 200 according to further illustrative embodiments wherein the initial thickness 201T may be reduced, for instance, by a removal process 205, which may include a mechanical polishing process. For example, chemical mechanical polishing (CMP) is a well-established manufacturing technique in semiconductor production and may be efficiently used for removing material of the substrate 201 in order to obtain a reduced thickness 201R that may be considered appropriate for a corresponding length of through holes to be formed in the substrate 201, for instance on the basis of a corresponding manufacturing technique as described above with reference to FIGS. 2*a*-2*b*.

Figure 2D:
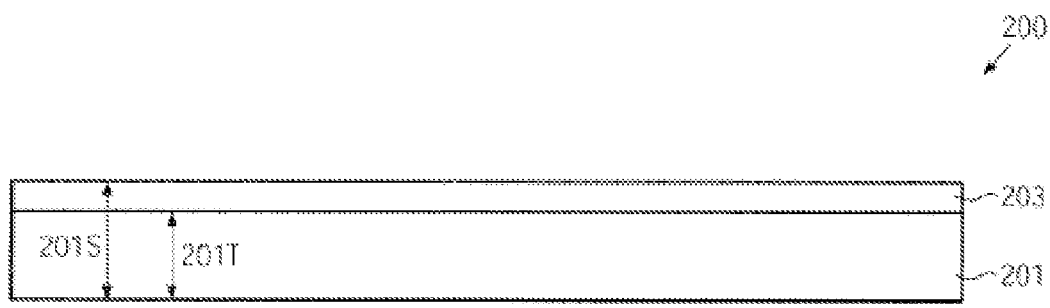
FIGS. 2d-2e schematically illustrate cross-sectional views of a semiconductor substrate during different manufacturing stages in adapting a thickness of the substrate material by deposition in order to increase the length of corresponding through holes for defining appropriate bonding wire diameters, according to further illustrative embodiments.

FIG. 2*d* schematically illustrates the device 200 according to further illustrative embodiments in which the initial thickness 201T may be increased by depositing an appropriate material 203, for instance a semiconductor material that may correspond to the material of the substrate 201, such as a silicon material, which may be accomplished by epitaxial growth techniques, low pressure chemical vapor deposition (CVD), plasma enhanced deposition techniques and the like. Hence, an increased thickness 201S may be obtained by means of the additional layer 203. In other cases, the material 203 may be provided so as to adjust specific material characteristics of the device 200 with respect to the subsequent employment as a template device for forming bonding wires. For instance, if adapted surface characteristics may be desired, the material 203 may be deposited with a specific composition and/or a respective surface treatment of the substrate 201 may be performed. For instance, silicon carbide, silicon nitride and the like may represent materials of high temperature stability and high mechanical integrity which may be efficiently used to provide specific surface conditions and which may also be used as a buffer material for obtaining a desired increased overall thickness of the device 200.

Figure 2E:
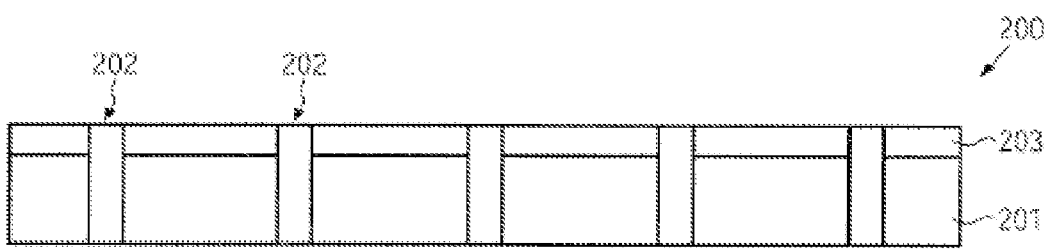

FIG. 2*e* schematically illustrates the device 200 in a further advanced manufacturing stage in which the openings 202 are formed so as to extend through the layer 203 and the substrate 201. For this purpose, similar process techniques may be used as described above, wherein, for instance, a first etch step may etch through the layer 203 and thereafter the etch chemistry may be appropriately adapted so as to etch through the substrate 201. Also, in this case, corresponding etch stop materials and hard mask materials may be used, if required.

Figure 2F:
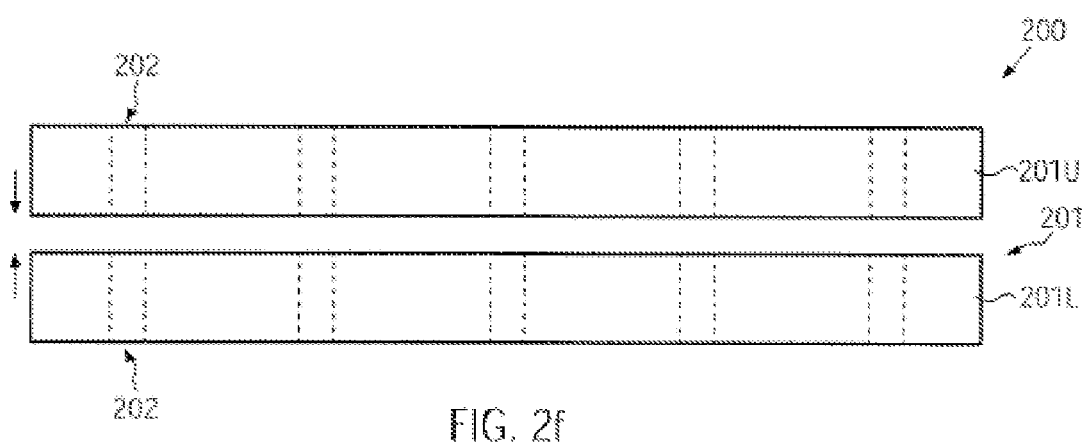
FIG. 2f schematically illustrates a cross-sectional view of two semiconductor substrates prior to performing a bonding process so as to obtain an increased total thickness of the substrate, wherein, prior to the bonding or after the bonding, respective through holes may be formed in accordance with the requirements for providing a template device for forming bonding wires, according to still further illustrative embodiments.

FIG. 2*f* schematically illustrates the device 200 according to further illustrative embodiments in which the substrate 201 may be comprised of two or more individual substrates 201L, 201U, which may be joined on the basis of well-established wafer bond techniques in order to form a composite substrate. For example, silicon wafers may be efficiently bonded by applying heat and pressure. In other cases, the substrates 201U, 201L may be treated so as to obtain an appropriate surface layer, such as a silicon dioxide layer, which may be accomplished by exposing these substrates to an oxidizing ambient in accordance with well-established process techniques. Also, in this case, the substrates 201U, 201L may be bonded on the basis of well-established recipes. It should be appreciated that other materials may be provided on the corresponding surface areas of the substrates 201U, 201L prior to the bonding process. For instance, silicon nitride, silicon carbide and the like may also be used as bonding surfaces. In some illustrative embodiments, each of the substrates 201U, 201L may have been treated so as to receive the corresponding openings 202, which may be formed on the basis of process techniques as described above. Due to the very precise process techniques, the openings 202 may still be aligned to each other, although the substrates 201L, 201U may be separately processed. In still other illustrative embodiments, the substrates 201U, 201L may be bonded first and may be subsequently processed to obtain the openings 202. For example, an intermediate material layer, such as a silicon dioxide layer, a silicon nitride layer and the like, may be efficiently used as an etch stop material so that enhanced controllability of the etch process may be accomplished. In other cases, the etch process may be performed from both sides, for instance one side after the other, if required. Also, in this case, the high degree of accuracy may result in a precise alignment of the corresponding openings that may be formed in separate etch steps. It should be appreciated that each of the techniques described above for modifying the thickness of the original substrate 201 may be combined so as to obtain a desired target thickness. For instance, if a very thick substrate may be required, a corresponding number of individual substrates may be bonded together and thereafter the fine tuning may be accomplished by one or more of the previously described process techniques, for instance by polishing a surface of the composite substrate or by depositing an additional material layer. In other cases, individual substrates or substrate composites may be treated at an intermediate stage, that is, prior to bonding all of the substrates together to avoid the processing of a very thick substrate, which possibly may not be compatible with the substrate handling capabilities of presently available semiconductor processing tools.

Figure 2G:
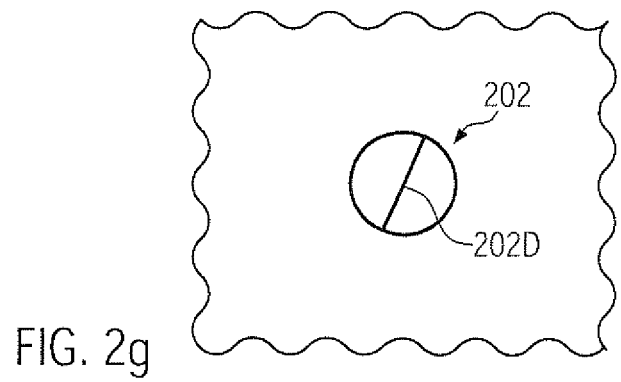
FIGS. 2g-2j schematically illustrate top views of respective substrate portions having formed therein corresponding template through holes for adjusting corresponding diameters and cross-sectional shapes of bonding wires, according to yet other illustrative embodiments.
Figure 2H:
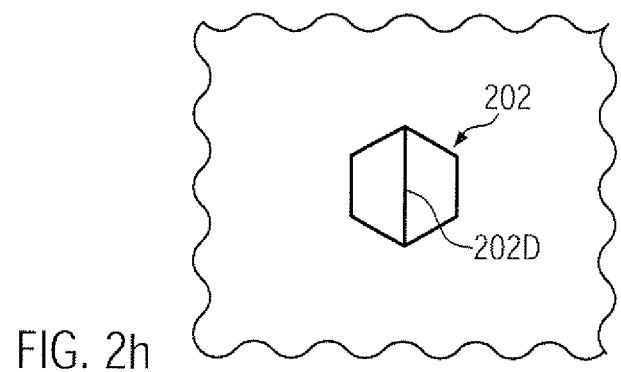
Figure 2I:
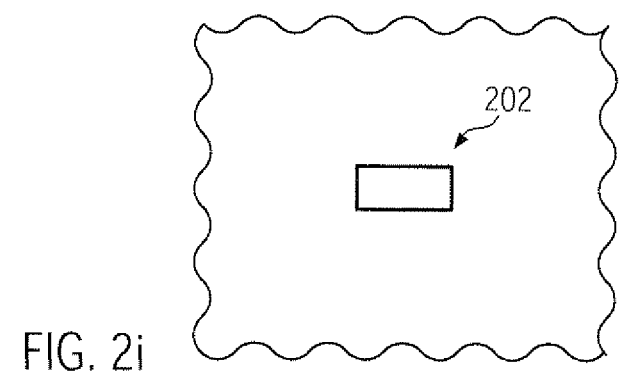
Figure 2J:
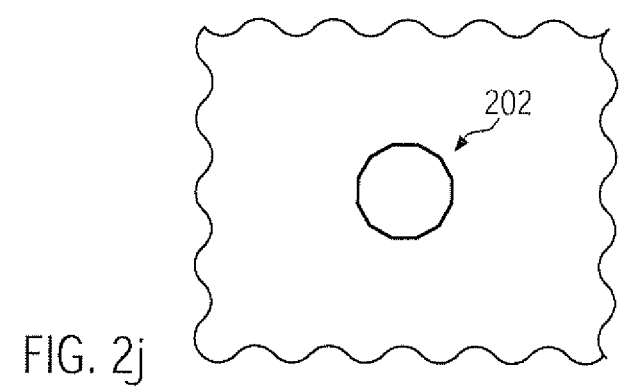

FIGS. 2g-2j schematically illustrate top views of various cross-sectional shapes of the template opening 202. FIG. 2g schematically illustrates the template opening 202 as having a substantially circular shape with a diameter 202D which may be selected in accordance with any requirements for forming the bonding wire. FIG. 2h schematically illustrates the template opening 202 as a hexagonal shape, wherein the diameter 202D may also be adjusted on the basis of a corresponding target value. Similarly, FIGS. 2i and 2j illustrate further examples of cross-sectional shapes of the opening 202. It should be appreciated, however, that any other desired cross-sectional shape may be defined on the basis of the lithography and etch techniques previously described. Hence, a high degree of flexibility in adjusting the diameter and the cross-sectional shape of corresponding bonding wires may be accomplished, thereby allowing adjusting to a certain degree the mechanical characteristics of the bonding wire during the bonding procedure.

Figure 2K:
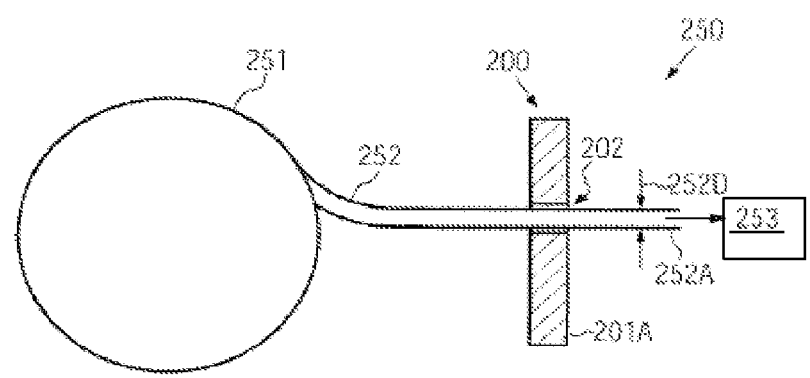
FIG. 2k schematically illustrates an apparatus for forming bonding wires on the basis of a template device formed on the basis of a semiconductor material, according to still other illustrative embodiments.

FIG. 2k schematically illustrates an apparatus 250 for providing a bond wire 252A having a desired target diameter 252D and a desired cross-sectional shape. The apparatus 250 may comprise a material source 251 that is configured to supply a preform 252 of the bonding wire 252A. For instance, the preform 252 may be provided in the form of a gold material, aluminum material, copper material or any other bonding material. Furthermore, mechanically attached to the material source 251 is the template device 200 including the body 201A, which may comprise a semiconductor material, such as silicon, silicon carbide, silicon/germanium and the like. In one illustrative embodiment, the body 201A is comprised of a crystalline silicon material. As previously indicated, the body 201A may comprise the template opening 202 that has a corresponding cross-sectional shape and a diameter wherein the diameter may vary along the depth or thickness of the body 201A, as previously explained. For instance, the opening 202 may be provided in the form of a tapered opening to accommodate the mechanical stress that may be created during the pulling of the preform 252 through the template opening 202. The corresponding pulling force may be supplied by a corresponding pulling device 253, which may have any appropriate configuration as is well established in the art. Thus, based on the template device 200, the preform 252 may be pulled through the template opening 202, thereby obtaining the bonding wire 252A with a desired target diameter 252D that is determined by the opening 202. Thus, due to the highly efficient and precise manufacturing technique for forming the device 200, any appropriate cross-sectional shape and diameter may be obtained for the bonding wire 252A based on a highly efficient and reproducible manufacturing process.

As a result, the present disclosure provides an apparatus, a template device and a corresponding method for forming a bonding wire, wherein well-established semiconductor fabrication techniques may be used in combination with appropriate semiconductor materials in order to provide an appropriate template device. Consequently, any desired target dimension and cross-sectional shape may be produced by providing a corresponding template device with a high degree of accuracy and reproducibility.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a patterned etch mask above a surface of a semiconductor substrate, said substrate having a thickness;
    performing at least one etching process on said semiconductor substrate through said patterned etch mask to define a plurality of openings that extend through said thickness of said substrate, each of said openings adapted to have a wire pulled therethrough; and
    cutting said substrate into a plurality of template devices, each of said template devices comprising at least one of said openings.

2. The method of claim 1, wherein said semiconductor substrate is comprised of at least one of silicon, silicon carbide or silicon germanium.

3. The method of claim 1, wherein performing said at least one etching process comprises performing said at least one etching process such that each of said openings, at some location along a depth of said opening, has a lateral dimension transverse to a thickness direction of said substrate that corresponds to a target dimension of a wire to be pulled through said opening.

4. The method of claim 1, wherein each of said plurality of openings has one of a circular, hexagonal or rectangular cross-sectional configuration at an upper surface of said substrate when viewed from above.

5. The method of claim 1, wherein performing said at least one etching process comprises performing said at least one etching process such that each of said openings is a tapered opening.

6. The method of claim 1, wherein performing said at least one etching process comprises performing said at least one etching process such that each of said openings has a constant diameter throughout the thickness of said substrate.

7. The method of claim 1, wherein performing said at least one etching process comprises performing said at least one etching process such that each of said openings exhibits some degree of tapering at some location within said substrate.

8. The method of claim 1, wherein performing said at least one etching process comprises performing said at least one etching process such that each of said openings exhibits some degree of tapering at some location along a depth direction of said opening.

9. The method of claim 1, wherein, prior to forming said patterned etch mask layer, the method further comprises depositing a material layer on said substrate or removing material of said substrate.

10. The method of claim 8, wherein removing material of said substrate comprises performing at least one of an etch process and a polishing process.

11. The method of claim 1, wherein, prior to forming said patterned etch mask, the method further comprises forming said substrate by bonding a first substrate consisting of silicon to at least one further substrate consisting of silicon.

12. The method of claim 11, wherein said openings are formed after bonding said first substrate to said at least one further substrate.

13. The method of claim 1, further comprising pulling a preform of a bonding wire through said at least one opening in one of said templates to obtain the bonding wire having a diameter defined by said opening.

14. A method, comprising:
   forming a patterned etch mask above a surface of a semiconductor substrate, said substrate having a thickness;
   performing at least one etching process on said semiconductor substrate through said patterned etch mask to define a plurality of openings that extend through said thickness of said substrate, each of said openings adapted to have a wire pulled therethrough, and wherein said at least one etching process is performed such that each of said openings exhibits some degree of tapering at some location within said substrate and each of said openings, at some location along a depth of said opening, has a lateral dimension transverse to a thickness direction of said substrate that corresponds to a target dimension of a wire to be pulled through said opening; and
   cutting said substrate into a plurality of template devices, each of said template devices comprising at least one of said openings.

15. The method of claim 14, wherein said semiconductor substrate is comprised of at least one of silicon, silicon carbide or silicon germanium.

16. The method of claim 14, wherein each of said plurality of openings has one of a circular, hexagonal or rectangular cross-sectional configuration at an upper surface of said substrate when viewed from above.

17. The method of claim 14, wherein performing said at least one etching process comprises performing said at least one etching process such that each of said openings is a continuously tapering opening.

18. The method of claim 14, wherein, prior to forming said patterned etch mask, the method further comprises depositing a material layer on said substrate or removing material of said substrate.

19. The method of claim 18, wherein removing material of said substrate comprises performing at least one of an etch process and a polishing process.

20. The method of claim 14, wherein, prior to forming said patterned etch mask, the method further comprises forming said substrate by bonding a first substrate consisting of silicon to at least one further substrate consisting of silicon.

21. The method of claim 20, wherein said openings are formed after bonding said first substrate to said at least one further substrate.

22. The method of claim 14, further comprising pulling a preform of a bonding wire through said at least one opening in one of said templates to obtain the bonding wire having a diameter defined by said opening.

23. A method, comprising:
   forming a first patterned etch mask above a surface of a first semiconductor substrate, said first substrate having a first thickness;
   performing at least one first etching process on said first semiconductor substrate through said first patterned etch mask to define a first plurality of openings that extend through said first thickness of said first substrate, each of said first plurality of openings adapted to have a wire pulled therethrough;
   forming a second patterned etch mask above a surface of a second semiconductor substrate, said second substrate having a second thickness;
   performing at least one second etching process on said second semiconductor substrate through said second patterned etch mask to define a second plurality of openings that extend through said second thickness of said second substrate, each of said second plurality of openings adapted to have said wire pulled therethrough;
   after forming said first and second plurality of openings, bonding said first substrate to said second substrate to define a final substrate, wherein said first and second plurality of openings are aligned during said bonding process so as to define a plurality of aligned openings; and
   cutting said final substrate into a plurality of template devices, each of said template devices comprising at least one of said aligned openings.

24. The method of claim 23, further comprising pulling a preform of a bonding wire through said at least one aligned opening in one of said templates to obtain the bonding wire having a diameter defined by said aligned opening.

* * * * *